(12) United States Patent
Mimotogi et al.

(10) Patent No.: US 7,148,138 B2
(45) Date of Patent: Dec. 12, 2006

(54) METHOD OF FORMING CONTACT HOLE AND METHOD OF MANUFACTURING SEMICONDUCTOR DEVICE

(75) Inventors: Shoji Mimotogi, Kanagawa (JP); Hiroko Nakamura, Kanagawa (JP); Kazuya Fukuhara, Tokyo (JP); Satoshi Tanaka, Kanagawa (JP); Soichi Inoue, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 252 days.

(21) Appl. No.: 10/969,996

(22) Filed: Oct. 22, 2004

(65) Prior Publication Data
US 2005/0153540 A1    Jul. 14, 2005

(30) Foreign Application Priority Data
Oct. 22, 2003  (JP)  .............................. 2003-362145

(51) Int. Cl.
*H01L 21/4763* (2006.01)
(52) U.S. Cl. ..................... 438/637; 438/689; 438/717
(58) Field of Classification Search ................ 438/637, 438/687, 717
See application file for complete search history.

(56) References Cited

U.S. PATENT DOCUMENTS 5,111,240 A * 5/1992 Boettiger et al. ............. 355/53

2002/0155356 A1 * 10/2002 Fujimoto ....................... 430/5

FOREIGN PATENT DOCUMENTS

JP          10-232496          9/1998

* cited by examiner

*Primary Examiner*—Thanh Nguyen
(74) *Attorney, Agent, or Firm*—Finnegan, Henderson, Farabow, Garrett & Dunner, L.L.P.

(57) ABSTRACT

A method of forming a contact hole on a substrate by using a projection aligner comprising a lighting system including a light source, an aperture, and a condenser lens, a photo mask on which light from the lighting system is incident, and a projection lens for projecting the light from the photo mask onto the substrate, comprises forming a first photosensitive resist film on the substrate; exposing the first photosensitive resist film by using a photo mask in which mask patterns are cyclically arranged in a first direction and a second direction which is orthogonal to the first direction and a first aperture having light transmission parts arranged symmetrically with respect to a center point in the first direction; developing the exposed first photosensitive resist film to form first lines and linear spaces; forming a second photosensitive resist film on the substrate; exposing the second photosensitive resist film by using the photo mask and a second aperture having light transmission parts arranged symmetrically with respect to a center point in the second direction; and developing the second photosensitive resist film to form second lines and linear spaces which are orthogonal to the first lines and linear spaces.

20 Claims, 12 Drawing Sheets

METHOD OF FORMING CONTACT HOLE AND METHOD OF MANUFACTURING SEMICONDUCTOR DEVICE

CROSS-REFERENCE TO RELATED APPLICATIONS

This application claims the benefit of priority under 35USC § 119 to Japanese Patent Application No. 2003-362145 filed on Oct. 22, 2003, the entire contents of which are incorporated herein by reference.

BACKGROUND OF THE INVENTION

1. Field of the Invention

The present invention relates to a method of forming a contact hole and a method of manufacturing a semiconductor device.

2. Related Background Art

In recent years, packing density of an LSI (Large Scale IC) increases rapidly and the cost in a lithography process sharply rises. Concretely, as the packing density increases (as an LSI becomes finer), the wavelength of exposure equipment is shortened or the numerical aperture of the exposure equipment becomes higher, so that the cost of exposure equipment increases.

A problem arises such that the techniques of shortening the wavelength and increasing the numerical aperture of exposure equipment cannot catch up with the speed of increase in packing density.

More specifically, in the lithography technique, it is particularly difficult to form a finer contact hole. It is very difficult to increase contrast to the optical image for a contact hole only by shortening the wavelength of exposure equipment or increasing the numerical aperture (achieving higher NA).

There is a technology such that a pattern of a linear space is transferred to a wafer, another pattern of a linear space orthogonal to the pattern of the linear space is transferred to the wafer, and a contact hole pattern is formed at the intersecting point of the linear spaces. To increase resolution of a contact hole by using the technology, it is preferable to transfer a pattern having repetition of a line and a linear space (lines and linear spaces) as each of the patterns. Specifically, by using a mask having a pattern having lines and linear spaces and a mask having a pattern having lines and linear spaces which are orthogonal to the pattern of lines and linear spaces (total two photo masks are used), contact hole patterns regularly arranged at lattice points in square are formed at the intersecting points of the linear spaces.

On the other hand, there is also a method of forming cyclic patterns and selectively leaving only necessary patterns of the cyclic patterns.

By combining the above two techniques, as described in JP-A 10-232496, contact hole patterns having a desired layout can be formed.

This method, however, requires three photo masks. From the viewpoint of cost, it is difficult to employ the method.

BRIEF SUMMARY OF THE INVENTION

According to a first aspect of the present invention, there is provided a method of forming a contact hole on a substrate by using a projection aligner comprising a lighting system including a light source, an aperture, and a condenser lens, a photo mask on which light from the lighting system is incident, and a projection lens for projecting the light from the photo mask onto the substrate, comprises forming a first photosensitive resist film on the substrate; exposing the first photosensitive resist film by using a photo mask in which mask patterns are cyclically arranged in a first direction and a second direction which is orthogonal to the first direction and a first aperture having light transmission parts arranged symmetrically with respect to a center point in the first direction; developing the exposed first photosensitive resist film to form first lines and linear spaces; forming a second photosensitive resist film on the substrate; exposing the second photosensitive resist film by using the photo mask and a second aperture having light transmission parts arranged symmetrically with respect to a center point in the second direction; and developing the second photosensitive resist film to form second lines and linear spaces which are orthogonal to the first lines and linear spaces.

According to a second aspect of the present invention, there is provided a method of manufacturing a semiconductor device by using a projection aligner comprising a lighting system including a light source, an aperture, and a condenser lens, a photo mask on which light from the lighting system is incident, and a projection lens for projecting the light from the photo mask onto the substrate, comprises forming a first photosensitive resist film on the substrate on which devices are formed; exposing the first photosensitive resist film by using a photo mask in which mask patterns are cyclically arranged in a first direction and a second direction which is orthogonal to the first direction and a first aperture having light transmission parts arranged symmetrically with respect to a center point in the first direction; developing the exposed first photosensitive resist film to form first lines and linear spaces; forming a second photosensitive resist film on the substrate; exposing the second photosensitive resist film by using the photo mask and a second aperture having light transmission parts arranged symmetrically with respect to a center point in the second direction; and developing the second photosensitive resist film to form second lines and linear spaces which are orthogonal to the first lines and linear spaces.

DETAILED DESCRIPTION OF THE INVENTION

First Embodiment

Figure 1:
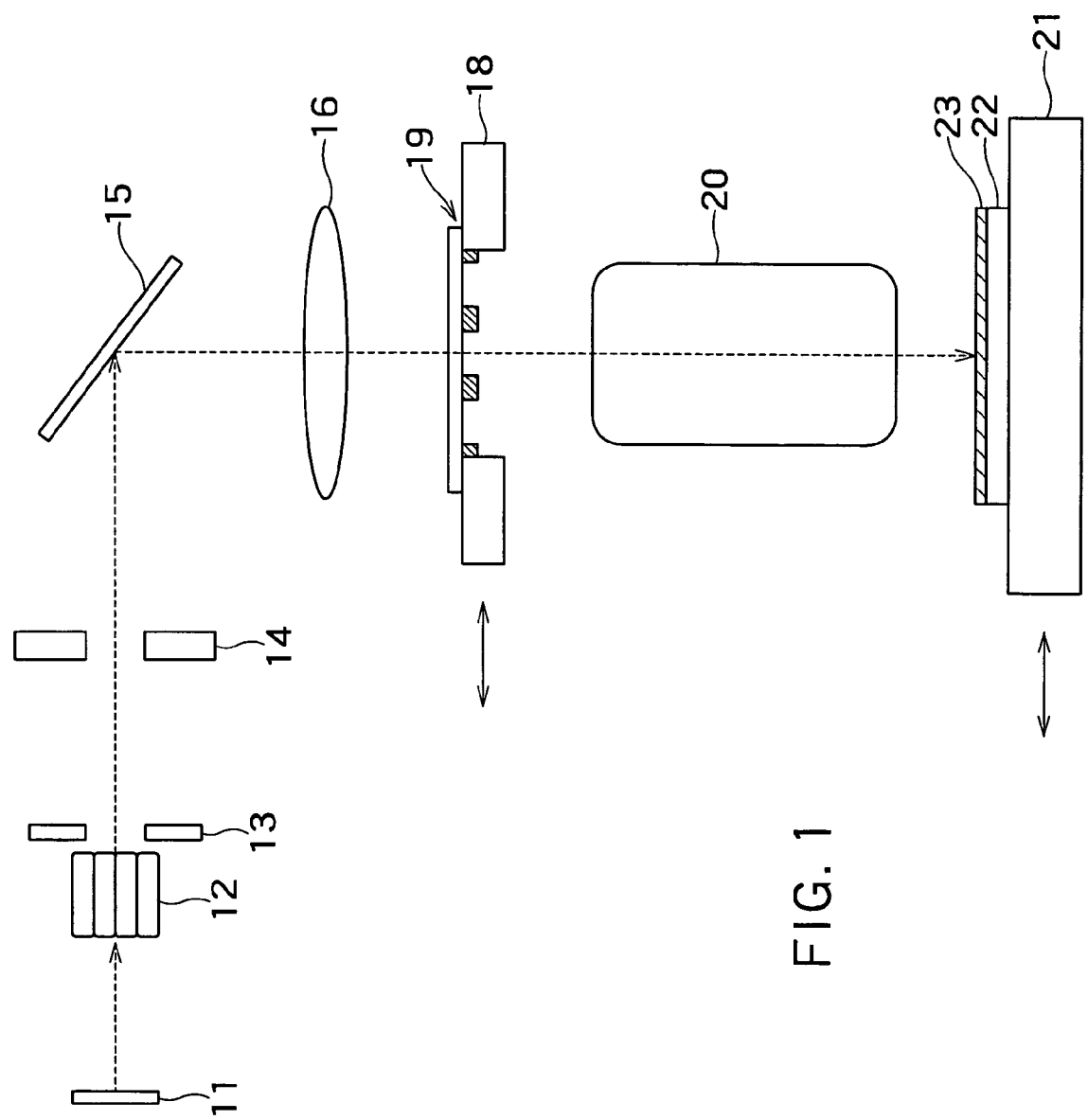
FIG. 1 is a schematic diagram of exposure equipment used in a first embodiment of the invention.

FIG. 1 is a schematic diagram of exposure equipment used in a first embodiment of the invention.

In the exposure equipment, a laser beam emitted from a light source 11 enters a fly eye lens 12 where luminance unevenness is suppressed and, after that, resultant light passes through an aperture 13 and a reticle blind 14. The transmission light is reflected by a reflecting mirror 15 and condensed by a condenser lens 16. The condensed light is incident on a reticle (photo mask) 19 on a reticle stage 18 which is movable in the directions of the arrow in the diagram and the incident light is diffracted by a pattern of the photo mask 19. The diffracted light is converged by a projection lens 20 and is incident on a resist film 23 on the surface of a wafer 22 mounted on a wafer stage 21 which is movable in the directions of the arrow in the diagram. In such a manner, the pattern of the photo mask 19 is transferred to the resist film 23.

The principle of the invention will now be described by using the exposure equipment.

Figure 2A:
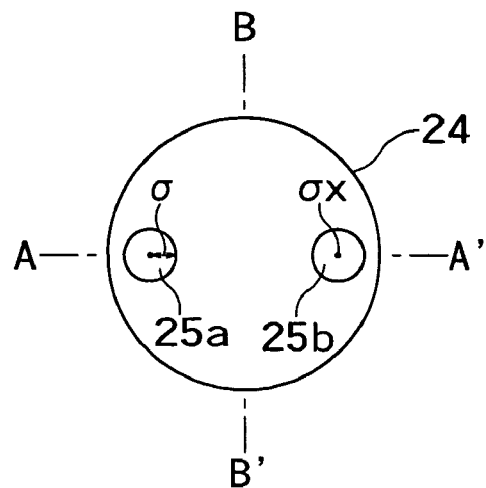
FIGS. 2A to 2C is a diagram for explaining the principle of the present invention.

FIG. 2A is a plan view of an aperture 24 having two holes 25a and 25b. The holes 25a and 25b have the same circular shape and the radius of each of the holes 25a and 25b is a. The holes 25a and 25b are disposed symmetrically about the center point (the intersecting point of the line A–A' and the line B–B') of the aperture 24. In the diagram, σx indicates the X coordinate at the center of the hole 25b when the center of the aperture 24 is the coordinates (0,0), the A' direction is the X axis, and the B direction is the Y axis.

Figure 2B:
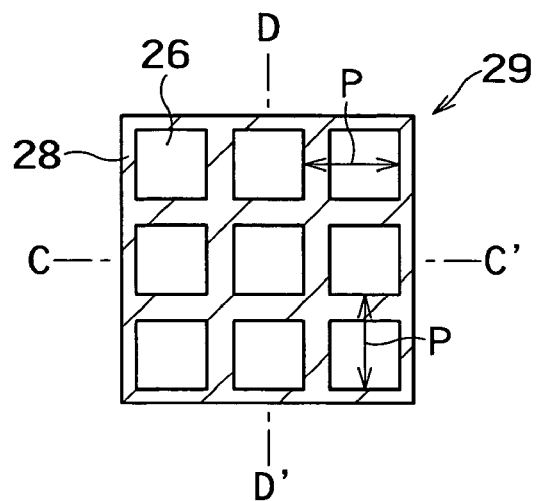

FIG. 2B is a plan view of a photo mask 29. The photo mask 29 has opening patterns 26 (contact hole patterns) arranged in a lattice state and a shield pattern 28. The opening patterns 26 each having a square shape in plan view are arranged at a pitch "p".

Figure 2C:
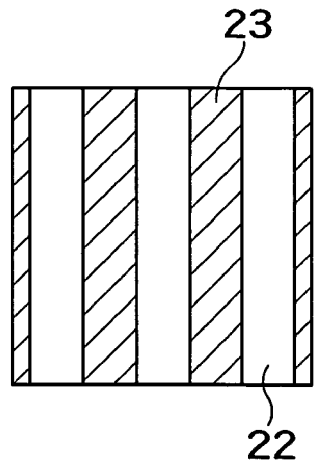

FIG. 2C is a diagram showing lines and linear spaces obtained in the case of exposing the resist film 23 shown in FIG. 1 by using the aperture 24 of FIG. 2A as the aperture 13 of the exposure equipment and using the photo mask 29 of FIG. 2B as the photo mask 19 of the exposure equipment. In other words, FIG. 2C shows lines and linear spaces obtained in the case of exposing the resist film 23 by double-poles illumination with the photo mask 29.

The principle capable of forming lines and linear spaces by using the aperture 24 of FIG. 2A and the photo mask 29 of FIG. 2B will be described hereinbelow.

Figure 3A:
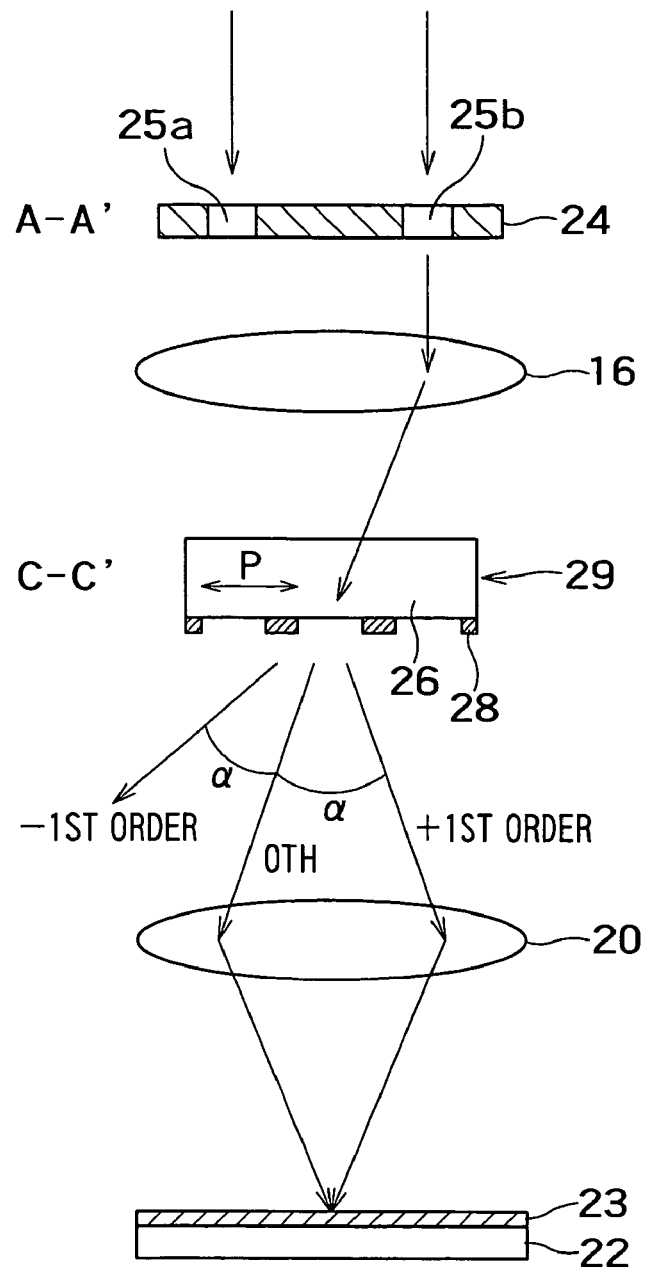
FIGS. 3A and 3B is a diagram for explaining the principle of the present invention.
Figure 3B:
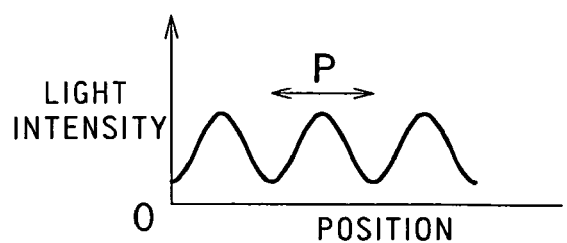

FIG. 3A is a diagram showing the loci of diffracted light at the time of exposure in cross section taken along line A–A' of FIG. 2A. The aperture 24 and the photo mask 29 are aligned so that the line A–A' of FIG. 2A and the line C–C' of FIG. 2B overlap each other. FIG. 3B is a diagram showing a light intensity distribution in the resist film 23 obtained at the time of exposure.

Figure 4A:
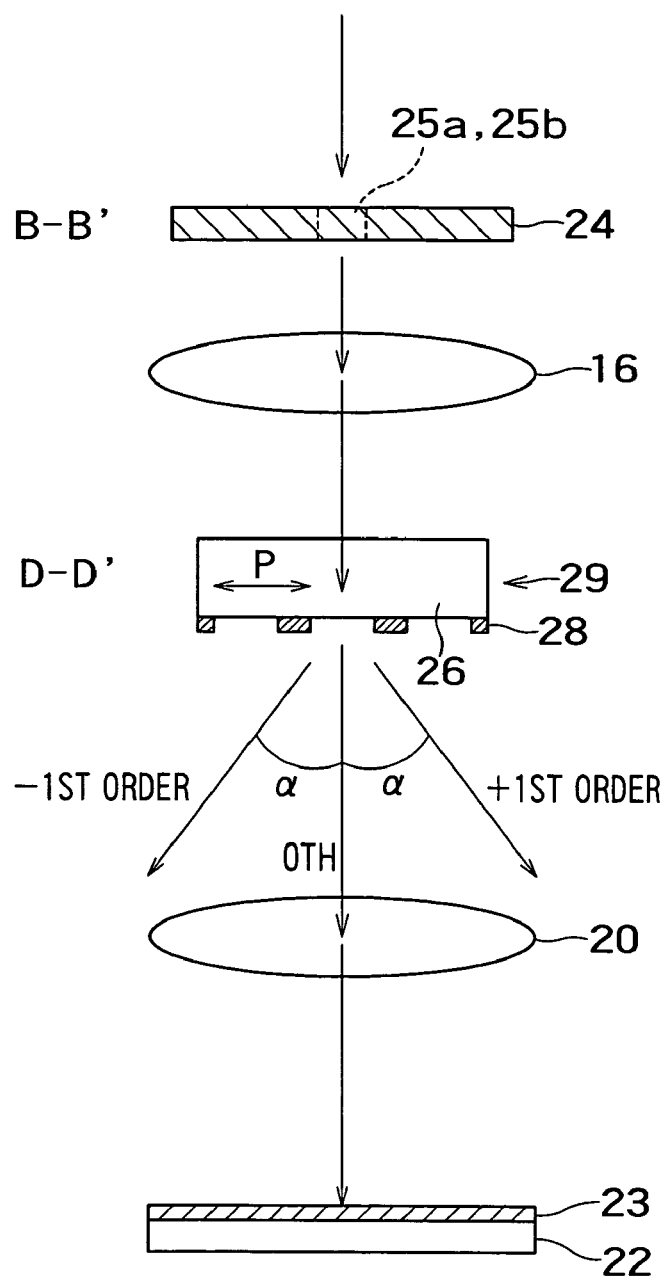
FIGS. 4A and 4B is a diagram for explaining the principle of the present invention.
Figure 4B:
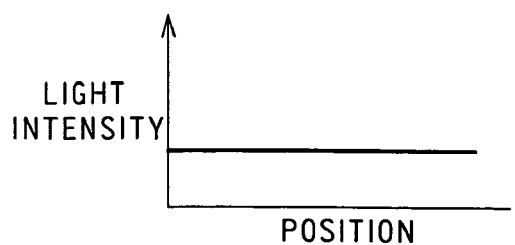

FIG. 4A is a diagram showing the loci of diffracted light at the time of exposure in cross section taken along line B–B' of FIG. 2A. The aperture 24 and the photo mask 29 are aligned so that the line B–B' of FIG. 2A and the line D–D' of FIG. 2B overlap each other. FIG. 4B is a diagram showing a light intensity distribution in the resist film 23 obtained at the time of exposure.

In FIGS. 3A and 4B, for simplicity of description, the exposure equipment of FIG. 1 is displayed in a simplified manner.

As shown FIG. 4A, in the cross section taken along line B–B' of FIG. 2A, light passed through the aperture 24 is perpendicularly incident on the photo mask 29 via the condenser lens 16. The light incident on the photo mask 29 is diffracted by the pattern of the photo mask 29 and the zeroth-order diffraction light in the same direction as that of the light incident on the photo mask 29 and the +1st-order diffraction light and the –1st-order diffraction light each forming the predetermined angle α from the zeroth-order diffraction light is generated (the 2nd and higher-order diffraction light is not shown). Among the diffraction light, only the zeroth-order diffraction light is incident on the projection lens 20 and reaches the resist film 23 on the wafer 22. The ±1st-order diffraction light having pattern information of the photo mask 29 does not reach the resist film 23. Therefore, the pattern of the photo mask 29 is not formed in the resist film 23. As a result, as shown in FIG. 4B, a constant light intensity distribution is obtained in the resist film 23. That is, the pattern in the lengthwise direction of the photo mask 29 in FIG. 2B is not formed.

It is assumed that the following equation is satisfied in the above case.

$$\sin \alpha = \lambda/p > NA \times (1+\sigma) \qquad \text{Equation 1}$$

where λ denotes the wavelength of exposure light, NA denotes the numerical aperture of the projection lens, σ indicates the size of illumination (radius of the hole) (refer to FIG. 2A), and p indicates the pattern pitch (refer to FIG. 2B).

As shown in FIG. 3A, in the cross section taken along line A–A' of FIG. 2A, light passed through the aperture 24 is condensed by the condenser lens 16 and is incident on the photo mask 29 at a predetermined angle with respect to the optical axis (diagonal incidence). The light incident on the photo mask 29 is diffracted by the pattern of the photo mask 29, and the zeroth-order diffraction light in the same direction as that of the light incident on the photo mask 29 and the +1st-order diffraction light and the –1st-order diffraction light each forming the predetermined angle α from the zeroth-order diffraction light is generated (the 2nd and higher order diffraction light is not shown). Among the diffraction light, the zeroth-order diffraction light and the +1st-order diffraction light is incident on the projection lens 20 and reaches the resist film 23 (two light fluxes interfere). As a result, the pattern of the photo mask 29 is formed in the resist film 23. That is, as shown in FIG. 3B, a cyclic light intensity distribution having a pitch which is optically the same as the arrangement pitch "p" of the patterns in the photo mask 29 is obtained in the resist film 23. It means that the pattern in the lateral direction of the photo mask 29 of FIG. 2B is formed.

It is assumed that the conditions of equation 1 and the following equation 2 are satisfied in the above case.

$$\sin \alpha = \lambda/p > NA \times (1+\sigma x+\sigma) \qquad \text{Equation 2}$$

where λ denotes the wavelength of exposure light, NA denotes the numerical aperture of the projection lens, σ indicates the size of lighting (radius of the hole) (refer to FIG. 2A), p indicates the pattern pitch (refer to FIG. 2B), and σx denotes the coordinate of illumination (coordinate of the center of the hole) (refer to FIG. 2A).

It is understood from the above that, by using the aperture 24 of FIG. 2A (double-poles illumination) and the photo mask 29 of FIG. 2B, lines and linear spaces as shown in FIG. 2C can be obtained. In other words, according to the principle of the invention, the patterns in the lateral direction of the photo mask of FIG. 2B are formed but the patterns in the lengthwise direction of the diagram are not formed. As a result, lines and linear spaces are formed.

By using the principle of the invention described above, contact holes arranged in a lattice state are formed. The embodiment will be described in detail hereinbelow.

The process for forming contact holes is roughly constructed by two processes (first and second processes).

Figure 5A:
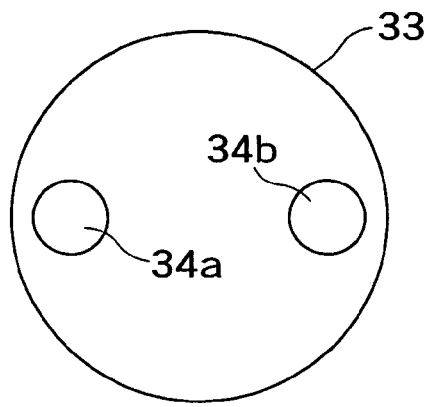
FIGS. 5A to 5D are diagrams illustrating the first process.
Figure 5B:
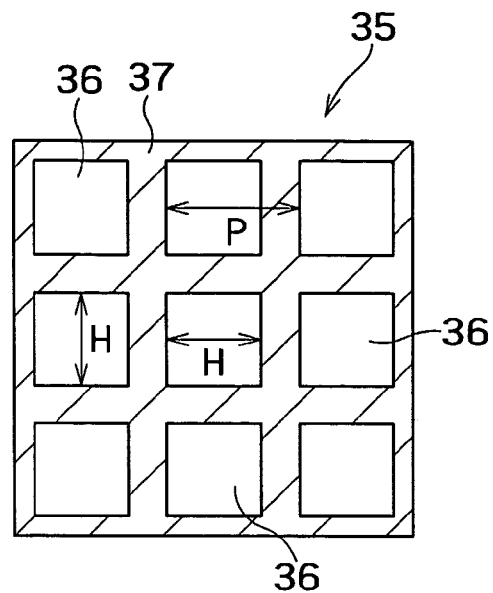
Figure 5C:
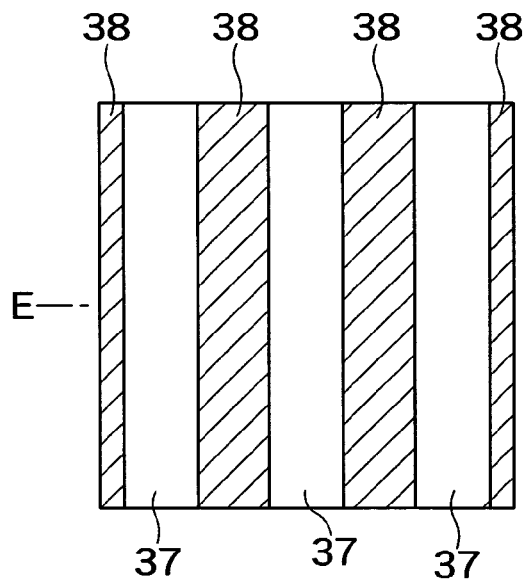
Figure 5D:
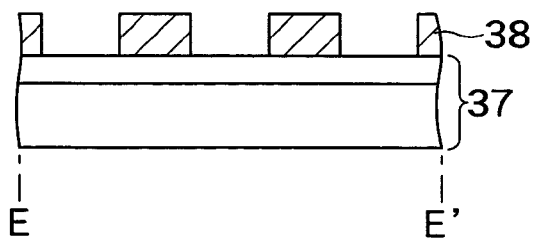

FIGS. 5A to 5D are diagrams illustrating the first process. More specifically, FIG. 5A is a plan view of an aperture 33 used in the first process. FIG. 5B is a plan view of a photo mask 35 used in the first process. FIG. 5C is a plan view of a semiconductor substrate including lines and linear spaces formed by the first process. FIG. 5D is a cross section taken along line E–E' of FIG. 5C. The first process will be described in detail hereinbelow.

First, a resist is applied on a substrate 37 on which devices are formed (refer to FIG. 5D) and is baked, thereby forming a first resist film 38 (refer to FIG. 5D). After that, the aperture 33 shown in FIG. 5A and the photo mask 35 shown in FIG. 5B are applied to the exposure equipment shown in FIG. 1 and first exposure is performed. Exposure parameters are, for example, that the exposure wavelength=193 nm and numerical aperture NA=0.85.

The aperture 33 shown in FIG. 5A has, as described in the principle of the invention, two holes 34a and 34b which are disposed symmetrically with respect to the center point of the aperture 33. The photo mask 35 shown in FIG. 5B has opening patterns (contact hole patterns) 36 and a shield pattern 37. The opening patterns 36 are arranged at a pitch P and each opening has a width H.

By the first exposure, a pattern image of lines and linear spaces is transferred to the resist film 38 in accordance with the principle of the invention. After that, by performing a developing process, as shown in FIG. 5C, lines and linear spaces in which the resist film 38 as lines are cyclically arranged in the lateral direction in the diagram are formed on the substrate 37. That is, only the patterns in the lateral direction of the photo mask 35 in FIG. 5B are formed and the patterns in the lengthwise direction are not formed.

Figure 6A:
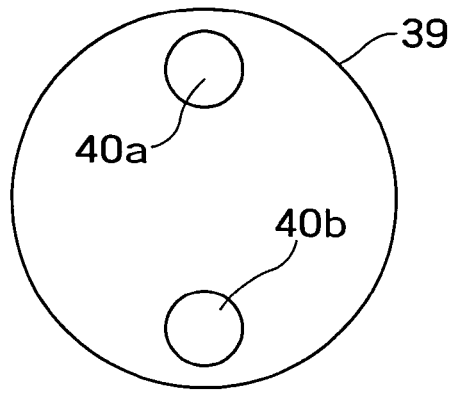
FIGS. 6A to 6E are diagrams illustrating the second process which follows the first process.
Figure 6B:
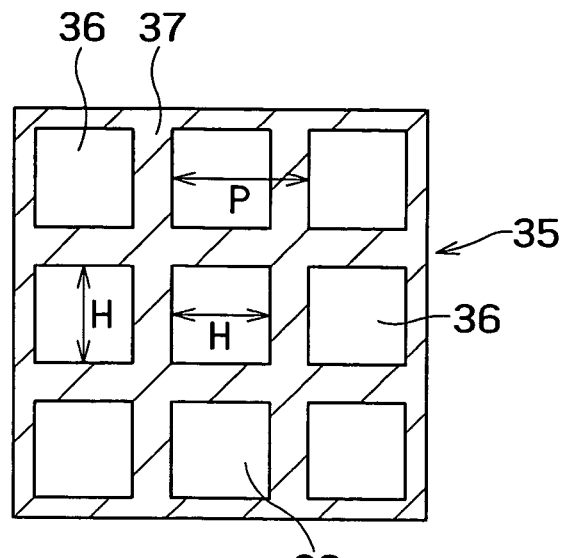
Figure 6C:
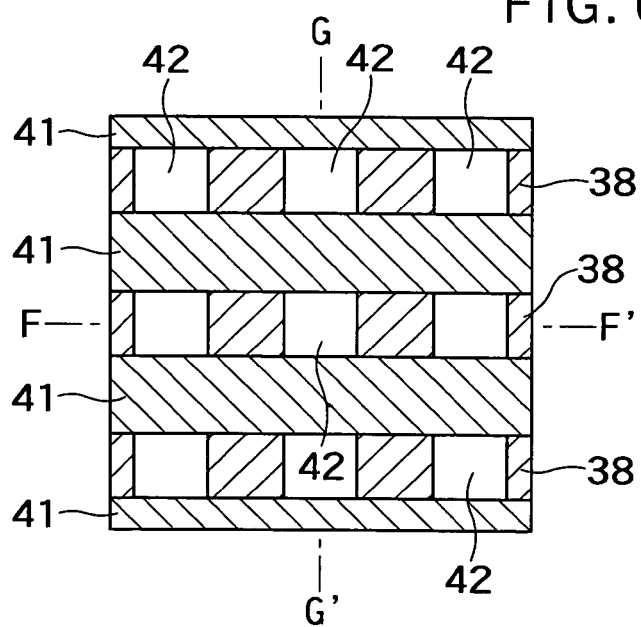
Figure 6D:
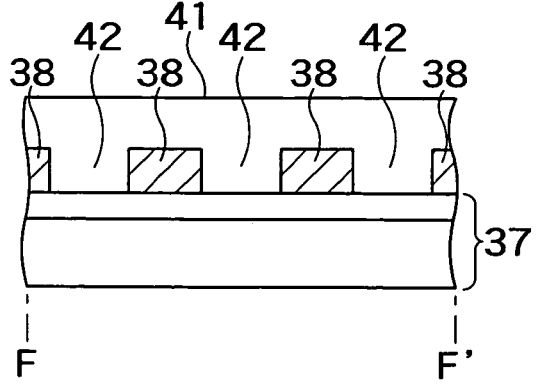
Figure 6E:
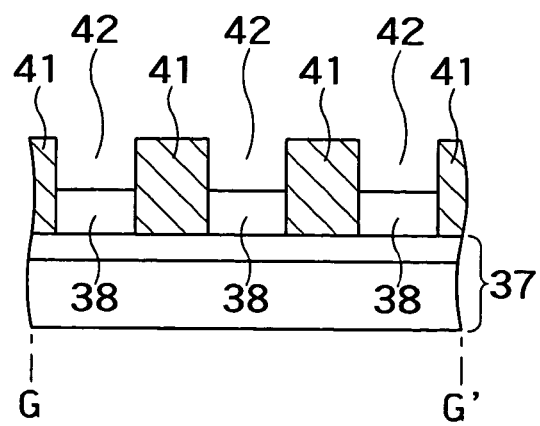

FIGS. 6A to 6E are diagrams illustrating the second process which follows the first process. More specifically, FIG. 6A is a plan view of an aperture 39 used in the second process. FIG. 6B is a plan view of the photo mask 35 used in the second process. FIG. 6C is a plan view of a semiconductor substrate including contact hole patterns 42 formed by the second process. FIG. 6D is a cross section taken along line F–F' of FIG. 6C. FIG. 6E is a cross section taken along line G–G' of FIG. 6C. The second process will be described in detail hereinbelow.

First, a resist is applied on the substrate 37 having the lines and linear spaces formed in the first process (refer to FIG. 5C) and is baked, thereby forming a second resist film 41 (refer to FIG. 6C). After that, second exposure is performed by using the aperture 39 shown in FIG. 6A and the photo mask 35 shown in FIG. 6B.

The aperture 39 shown in FIG. 6A has two holes 40a and 40b which are disposed symmetrically with respect to the center point of the aperture 39 in the lengthwise direction of the diagram. The aperture 39 and the aperture 33 shown in FIG. 5A have the relation such that when the aperture 33 of FIG. 5A is turned in the circumferential direction by 90 degrees, they overlap each other. That is, the second exposure is equivalent to the case of performing double-poles illumination in the direction orthogonal to that of the first exposure. The aperture 33 of FIG. 5A may be used by being turned by 90 degrees. The photo mask 35 shown in FIG. 6B is the same one as that shown in FIG. 5B. For simplicity of description, the photo mask 35 different from that used in the first process is shown. In practice, however, the photo mask used in the first process is used as it is. In short, only one photo mask 35 is used in the first and second processes.

By the second exposure, a pattern image of lines and linear spaces which are orthogonal to those of the first process is transferred to the resist film 41 in accordance with the principle of the invention. After that, by performing a developing process, as shown in FIG. 6C, lines and linear spaces in which the resist film 41 as lines are cyclically arranged in the lengthwise direction in the diagram are formed. In short, only the patterns in the lengthwise direction of the photo mask 35 in FIG. 6B are formed and the patterns in the lateral direction in the diagram are not formed.

At intersecting portions between the linear spaces in the lines and linear spaces formed in the first process and the linear spaces in the lines and linear spaces formed in the second process, as shown in FIG. 6C, the contact hole patterns 42 are formed in a lattice state. The contact hole patterns 42 are arranged at, for example, a pitch of 140 nm and each contact hole has the opening diameter of 70 nm.

Figure 7A:
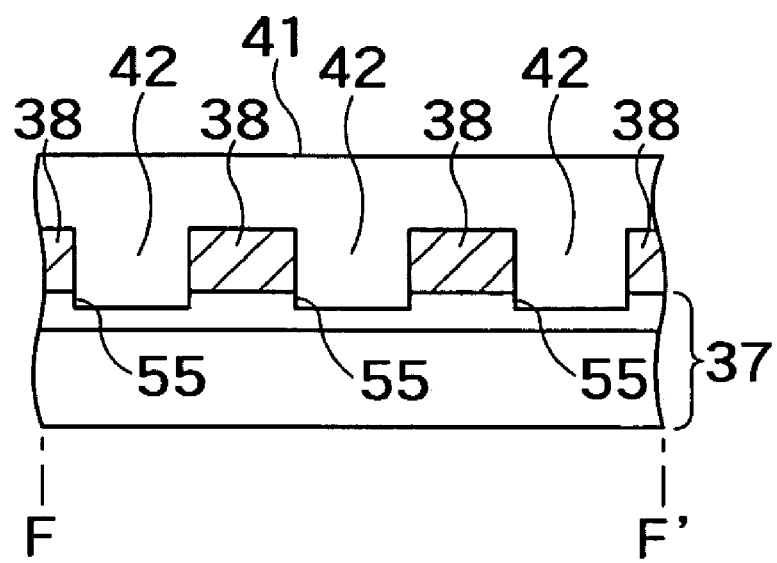
FIGS. 7A and 7B show a process of forming contact holes in the substrate by using the contact hole patterns.
Figure 7B:
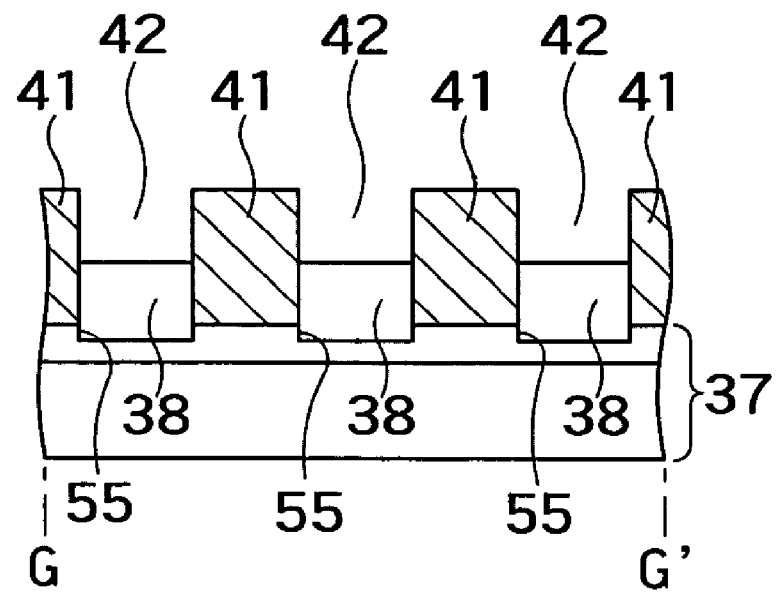

FIGS. 7A and 7B show a process of forming contact holes in the substrate 37 by using the contact hole patterns 42. FIG. 7A is a cross section taken along line F–F' of FIG. 6C and corresponds to FIG. 6D. FIG. 7B is a cross section taken along line G–G' of FIG. 6C and corresponds to FIG. 6E.

As shown in FIGS. 7A and 7B, by etching the substrate 37 with the contact hole patterns 42, that is, by etching the substrate 37 by using the resist films 38 and 41 as a mask, contact holes 55 are formed in the substrate 37.

By properly setting the relation between the width H of the opening pattern 36 and the arrangement pitch P of the opening patterns 36 in the photo mask 35 (refer to FIG. 5B) used in the first and second processes, the lithography margin (the ratio of allowable fluctuations in the exposure amount to dimensional specifications) can be increased.

Figure 8:
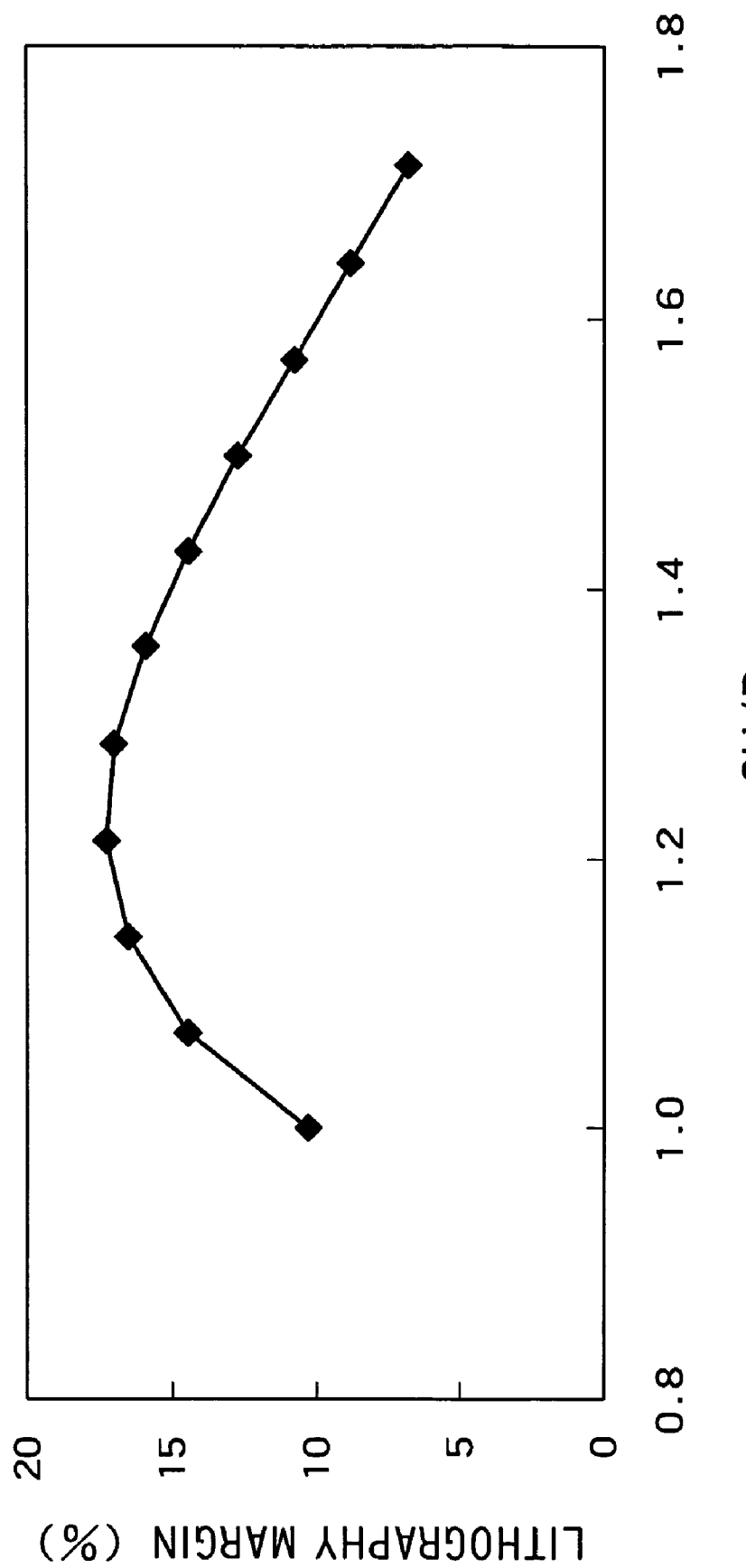
FIG. 8 is a graph whose horizontal axis shows 2×H/P and whose vertical axis shows the lithography margin.

FIG. 8 is a graph whose horizontal axis shows 2×H/P and whose vertical axis shows the lithography margin. The graph is formed on the basis of a result of simulation made by the inventors herein.

The inventors herein have found from the graph that when 2H/P lies in the range from 1 to 1.6, more preferably, from 1 to 1.4, a preferable lithography margin can be obtained.

In the embodiment, double-poles illumination is performed by using the aperture including holes each having a circular shape in plan view. The double-poles illumination can be performed by using an aperture whose shape is not limited to the circular shape but may be various shapes such as a fan shape.

It is also possible to perform a process of curing the resist film formed in the first process by using EB (Electron Beam) curing or UV (Ultra Violet) curing between the developing process in the first process and resist application in the second process.

As described above, in the embodiment, by using the photo mask in which the opening patterns (contact hole patterns) are arranged in a lattice state and the double-poles illumination, the lines and linear spaces which are orthogonal to each other can be formed. That is, a group of contact holes densely arranged can be formed with one photo mask while assuring high resolution. Conventionally, two photo masks have to be used at least to form contact holes at high density. In the embodiment, a group of contact holes can be formed at high density with one photo mask.

Second Embodiment

In a second embodiment, by leaving a contact hole positioned in the center of the group of contact holes formed in the first embodiment and eliminating the other contact holes, an isolated contact hole is formed. To form the isolated contact hole, a third process which will be described below is performed subsequent to the above first and second processes.

FIGS. 9A to 9E are diagrams illustrating the third process.

Figure 9A:
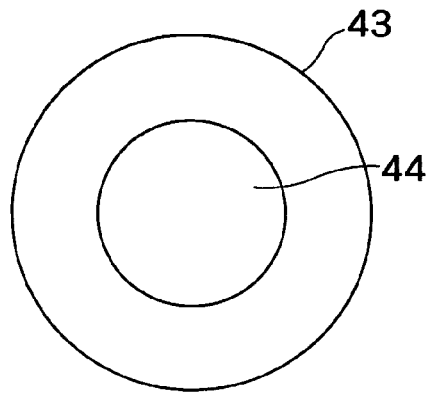
FIGS. 9A to 9E are diagrams illustrating the third process.
Figure 9B:
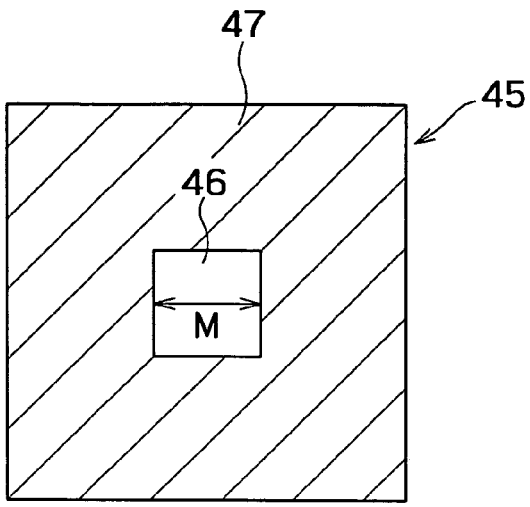
Figure 9C:
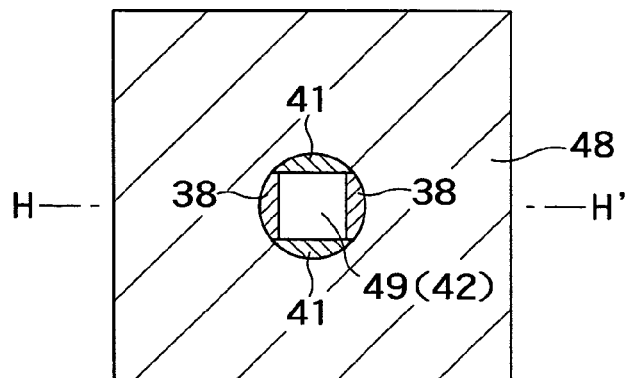
Figure 9D:
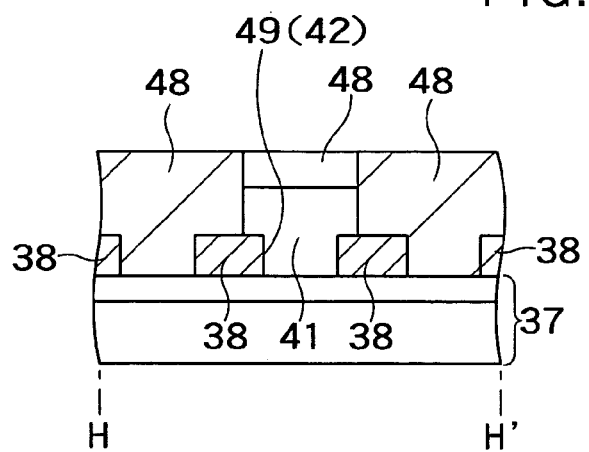
Figure 9E:
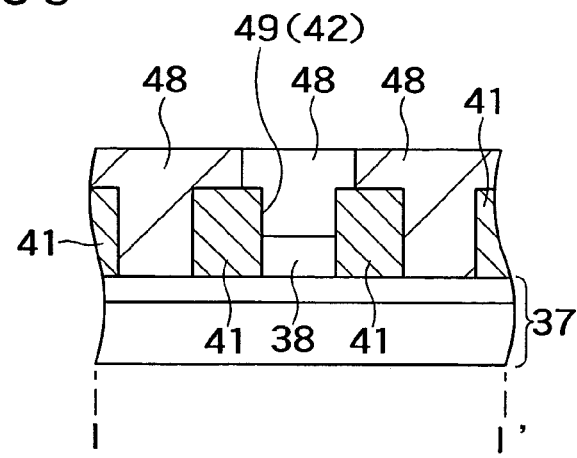

More specifically, FIG. 9A is a plan view showing an aperture 43 having a hole 44 in its center portion. FIG. 9B is a plan view of a photo mask 45 having an opening pattern 46 corresponding to one contact hole and a shield pattern 47. FIG. 9C is a plan view showing one contact hole pattern 49 selectively left by the third process. FIG. 9D is a cross section taken along line H–H' of FIG. 9C. FIG. 9E is a cross section taken along line I–I' of FIG. 9C.

In the third process, a resist is applied on the substrate (refer to FIG. 6C) obtained by the second process and is baked, thereby forming a third resist film 48 (refer to FIG. 9C). After that, the third resist film 48 is selectively exposed as shown in FIG. 9C by using the aperture 43 shown in FIG. 9A and the photo mask 45 shown in FIG. 9B and is subjected to developing process, thereby forming the isolated contact hole pattern 49. In other words, only the contact hole pattern 42 in the center is left among the number of contact hole patterns 42 (refer to FIG. 6C) formed in the second process, and the other contact holes are buried in the resist film 48.

In the process of developing the resist film 48, the contact hole pattern 42 in the center (refer to FIG. 9C) has to be exposed with reliability. Consequently, the width M of the opening pattern 46 in the photo mask 45 of FIG. 9B is preferably larger than the width H of the opening pattern 36 in the photo mask 35 of FIG. 5B. More preferably, the width M is set to be larger than the arrangement pitch P of the opening patterns 36.

As described above, according to the second embodiment, only one of contact hole patterns formed by the second process is selectively left and the other contact hole patterns are buried by the resist film. Thus, an isolated contact hole can be formed without deteriorating resolution.

Third Embodiment

In the second embodiment, only one contact hole pattern is left among the group of contact hole patterns formed in the second process. In a third embodiment, a plurality of contact hole patterns are selectively left among the group of contact hole patterns formed in the second process, thereby selectively forming a plurality of contact holes. The third embodiment will be described in detail hereinbelow with reference to FIGS. 10A and 10B and FIG. 11.

Figure 10A:
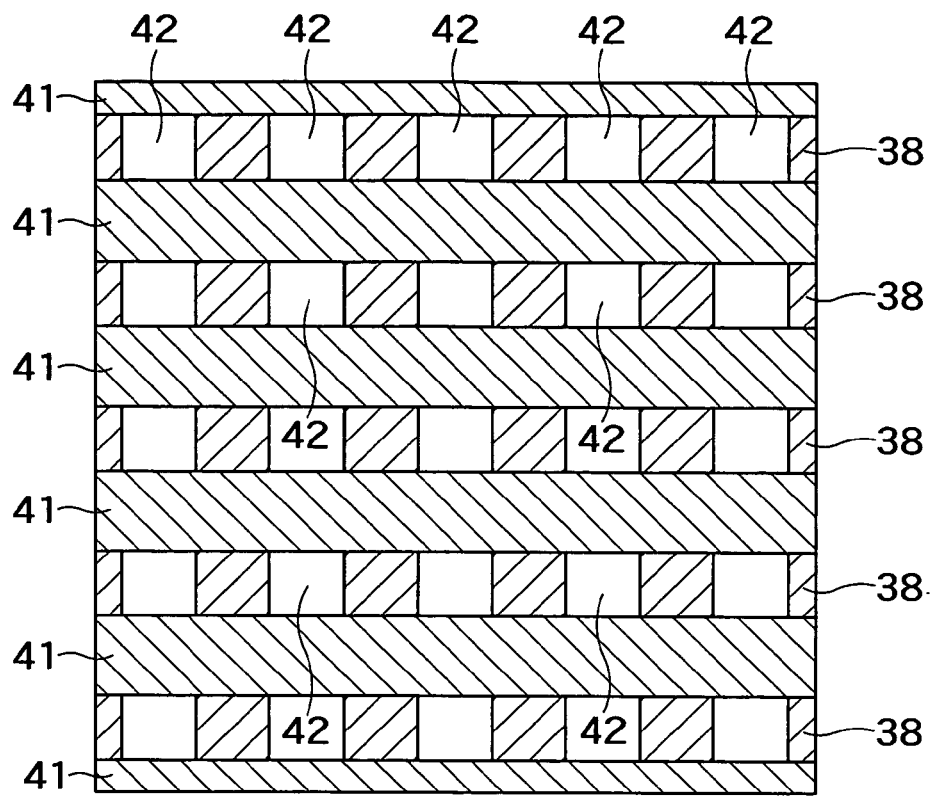
FIGS. 10A and 10B is a diagram for explaining a third embodiment of the invention.
Figure 10B:
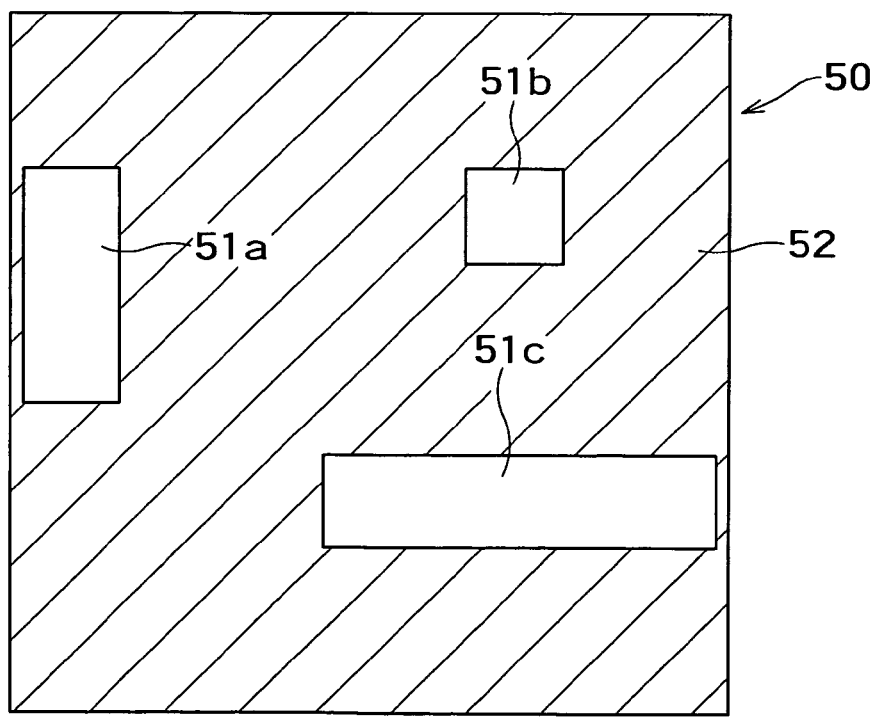

FIG. 10A is a plan view of a semiconductor substrate in which contact hole patterns are arranged in a lattice state by the first and second processes. FIG. 10B is a plan view of a photo mask used in the third embodiment. A photo mask 50 has opening patterns 51a to 51c corresponding to contact hole patterns to be left and a shield pattern 52. Each of the opening patterns 51a to 51c is re-sized to about twice as large as the pattern size necessary for forming a contact hole of a size necessary in a device.

Figure 11:
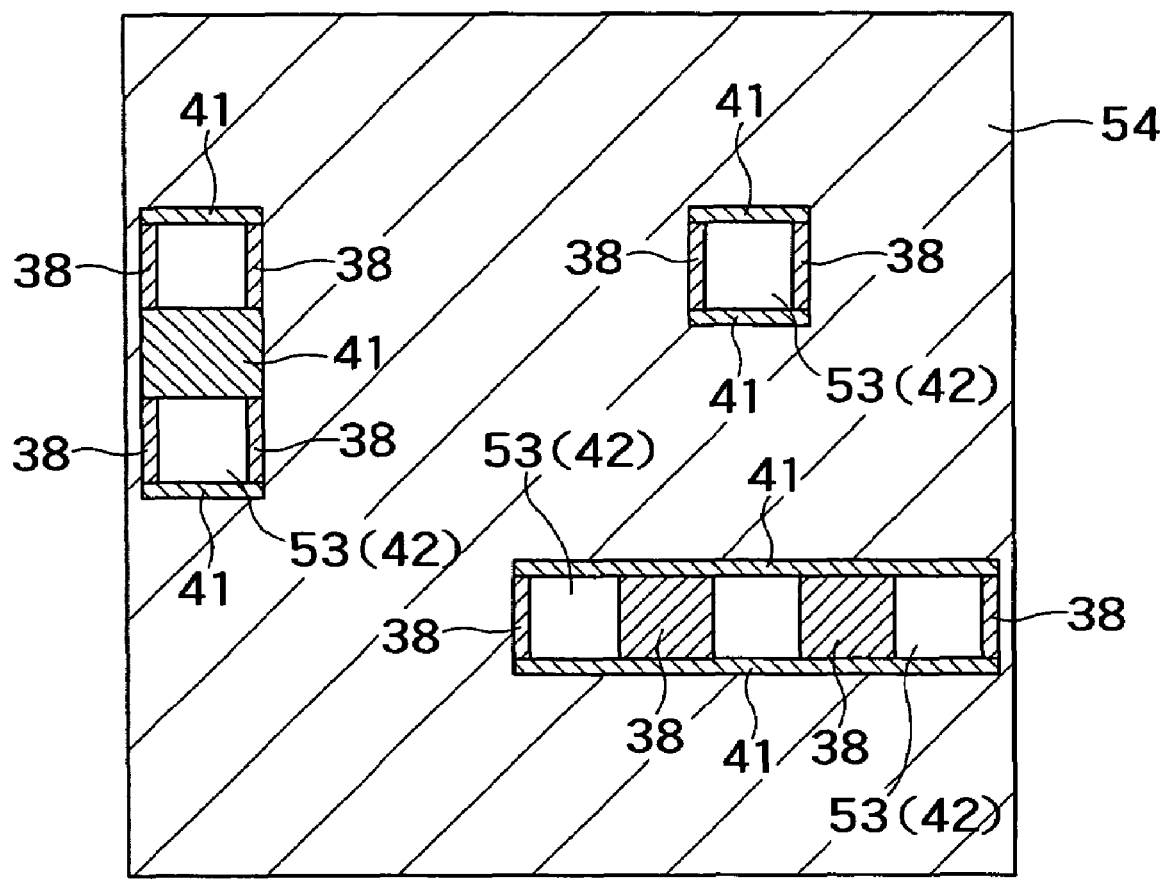
FIG. 11 is a plan view of a semiconductor substrate in which the contact hole patterns are selectively left in the third embodiment.

FIG. 11 is a plan view of a semiconductor substrate in which the contact hole patterns are selectively left in the third embodiment.

First, the first and second processes are performed to make a substrate in which the contact hole patterns 42 are arranged in a lattice state as shown in FIG. 10A.

Next, a resist is applied on the substrate and baked, thereby forming a fourth resist film 54 (refer to FIG. 11).

By using the photo mask 50 shown in FIG. 10B and the aperture 43 shown in FIG. 9A, the fourth resist film 54 is exposed to transfer the pattern of the photo mask 50 to the fourth resist film 54. After that, the fourth resist film 54 is developed, thereby selectively forming contact hole patterns 53 as shown in FIG. 11. In other words, only contact hole patterns necessary for forming a device are opened among the contact hole patterns 42 which are formed by the second process.

As understood by comparison between the opening patterns 51a to 51c in the photo mask 50 of FIG. 10B and FIG. 11, it is possible to form a plurality of contact hole patterns 53 arranged adjacent to each other by one opening pattern. Consequently, it is unnecessary to form one opening pattern to one contact hole pattern, so that the photo mask can be produced simply.

As described above, according to the third embodiment, the contact hole pattern group formed by the second process is selectively left and the other contact hole patterns are buried by a resist film. Thus, while assuring high resolution, a plurality of contact holes can be selectively formed.

Fourth Embodiment

In the process of developing the second resist film 41 in the first embodiment (refer to FIG. 6C), the first resist film 38 may dissolve according to the kind of a solvent used for development. When the first resist film 38 dissolves, the pattern of the first resist film 38 is deformed and the dissolved first resist film 38 and the dissolved second resist film 41 are mixed. When mixing occurs, the density of a developing solution is lowered, and it may cause a problem that the second resist film 41 is not formed in a desired pattern. In the fourth embodiment, therefore, a method of forming the second resist film 41 while preventing the mixing will be described.

Figure 12A:
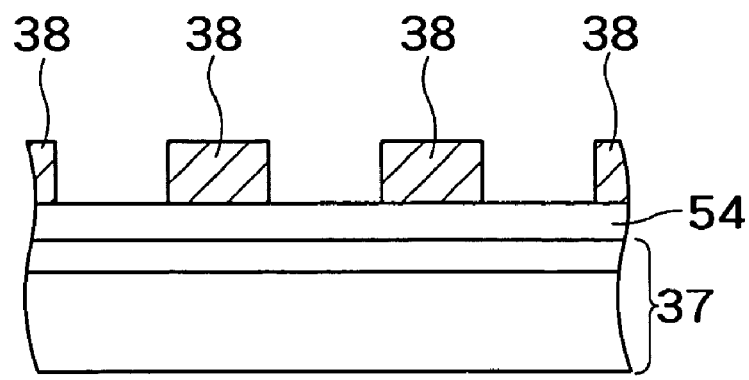
FIGS. 12A to 12C are manufacturing process cross sections illustrating a fourth embodiment of the invention.
Figure 12B:
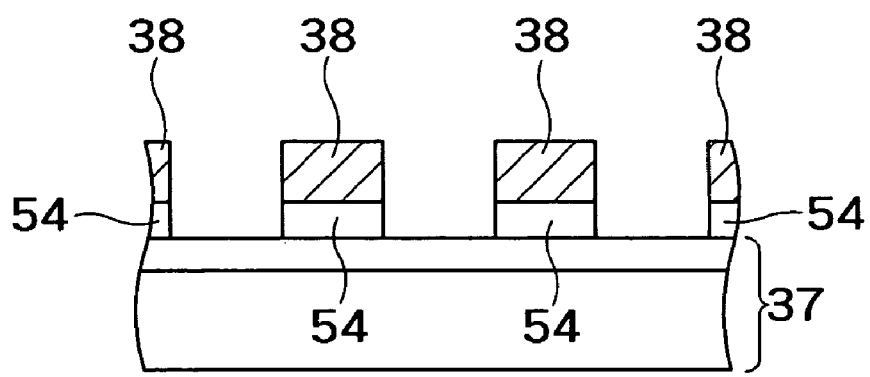
Figure 12C:
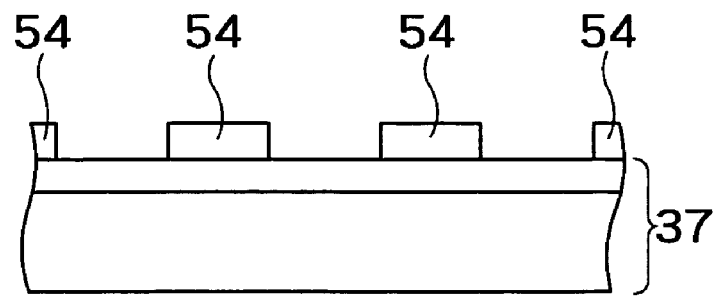

FIGS. 12A to 12C are manufacturing process cross sections illustrating the fourth embodiment.

By performing the processes shown in FIGS. 12A to 12C in place of the first process and then performing the second process, while preventing the mixing, the second resist film 41 can be formed. The fourth embodiment will be described below more specifically.

First, as shown in FIG. 12A, an under film 54 which takes the form of, for example, a nitride film is formed on the substrate 37. After that, by a procedure similar to the first process, lines and linear spaces in which the first resist film 38 as lines is cyclically arranged are formed.

As shown in FIG. 12B, the first resist film 38 is used as a mask and the under film 54 is etched by reactive ion etching or the like.

As shown in FIG. 12C, the first resist film 38 on the under film 54 is removed. As a result, lines and linear spaces in which the under film 54 as lines is cyclically arranged are formed. After that, by a procedure similar to the second process (refer to FIG. 6), lines and linear spaces orthogonal to the lines and linear spaces formed by the process shown in FIGS. 12A to 12C are formed.

In the fourth embodiment, the resist film 38 is formed directly on the under film 54 as shown in FIG. 12A. An anti-reflection film may be formed between the resist film 38 and the under film 54.

As described above, in the fourth embodiment, the lines and linear spaces formed by the under film are formed in place of the lines and linear spaces formed by the first resist film 38. Thus, occurrence of the mixing in the process of developing the second resist film 41 can be prevented.

The invention is not limited to the foregoing embodiments. For example, as a photo mask, a Cr (chromium) mask having transmittance of zero or a halftone phase-shift mask can be also used. The invention can be variously modified without departing from the gist of the invention.

What is claimed is:

1. A method of forming a contact hole on a substrate by using a projection aligner comprising a lighting system including a light source, an aperture, and a condenser lens, a photo mask on which light from the lighting system is incident, and a projection lens for projecting the light from the photo mask onto the substrate, comprising:

forming a first photosensitive resist film on the substrate;

exposing the first photosensitive resist film by using a photo mask in which mask patterns are cyclically arranged in a first direction and a second direction which is orthogonal to the first direction and a first aperture having light transmission parts arranged symmetrically with respect to a center point in the first direction;

developing the exposed first photosensitive resist film to form first lines and linear spaces;

forming a second photosensitive resist film on the substrate;

exposing the second photosensitive resist film by using the photo mask and a second aperture having light transmission parts arranged symmetrically with respect to a center point in the second direction; and developing the second photosensitive resist film to form second lines and linear spaces which are orthogonal to the first lines and linear spaces.

2. The method according to claim 1, wherein contact holes are formed on the substrate by etching the substrate by using the first and second photosensitive resist films as a mask.

3. The method according to claim 1, further comprising:

after the second lines and linear spaces are formed, forming a third photosensitive resist film on the substrate;

aligning another photo mask having a mask pattern for selecting an intersecting portion among intersecting portions of linear spaces in the first and second lines and linear spaces so that the mask pattern and the intersecting portion correspond to each other, and exposing the third photosensitive resist film; and developing the third photosensitive resist film.

4. The method according to claim 3, wherein each of the mask pattern in the photo mask and the mask pattern in the another photo mask has a square shape in plan view, and one side of the mask pattern in the another photo mask is longer than that of the mask pattern in the photo mask.

5. The method according to claim 4, wherein one side of the mask pattern in the another photo mask is larger than an arrangement pitch of the mask patterns in the photo mask.

6. The method according to claim 3, wherein a contact hole is formed on the substrate by etching the substrate by using the third photosensitive resist film as a mask.

7. The method according to claim 1, further comprising:

after the second lines and linear spaces are formed, forming a third photosensitive resist film on the substrate;

aligning a photo mask having a single mask pattern for selecting a plurality of intersecting portions adjacent to each other from intersecting portions of linear spaces in the first and second lines and linear spaces so that the single mask pattern corresponds to the plurality of intersecting portions adjacent to each other, and exposing the third photosensitive resist film; and developing the third photosensitive resist film.

8. The method according to claim 7, wherein the substrate is etched by using the third photosensitive resist film as a mask to form contact holes on the substrate.

9. The method according to claim 1, wherein a film to be processed is formed on the substrate before the first photosensitive resist film is formed, after development of the first photosensitive resist film and before formation of the second photosensitive resist film, the film to be processed is etched by using the first photosensitive resist film as a mask, and after the etching, the first photosensitive resist film is removed to form lines and linear spaces by the film to be processed.

10. The method according to claim 1, wherein after development of the first photosensitive resist film and before formation of the second photosensitive resist film, at least one of an electron curing process and an ultraviolet curing process is performed on the first photosensitive resist film.

11. The method according to claim 1, wherein an aperture including the light transmission part having a circular shape in plan view is used as the first and second apertures.

12. The method according to claim 11, wherein a photo mask in which the mask pattern has a square shape in plan view is used as the photo mask.

13. The method according to claim 12, wherein the first and second apertures have a relation such that in the case where the first aperture is turned in the circumferential direction by 90 degrees, they overlap each other.

14. The method according to claim 13, wherein the first and second photosensitive resist films are exposed so as to hold the following equations 1 and 2

$$\sin \alpha = \lambda/p > NA \times (1+\sigma) \qquad \text{Equation 1}$$

$$\sin \alpha = \lambda/p > NA \times (1+\sigma x+\sigma) \qquad \text{Equation 2}$$

where $\lambda$ denotes the wavelength of exposure light, NA denotes the numerical aperture of the projection lens, $\sigma$ indicates the radius of the light transmission part, p indicates an arrangement pitch of the mask patterns, and $\sigma x$ denotes distance from the center of the first and second apertures to the center of the light emission part.

15. The method according to claim 1, wherein a photo mask in which the mask pattern has a square shape in plan view is used as the photo mask.

16. The method according to claim 15, wherein, in the case where length of one side of the mask pattern is H and an arrangement pitch of the mask patterns is P, a photo mask holding $$1 < 2 \times H/P < 1.4$$

is used as the photo mask.

17. A method of manufacturing a semiconductor device by using a projection aligner comprising a lighting system including a light source, an aperture, and a condenser lens, a photo mask on which light from the lighting system is incident, and a projection lens for projecting the light from the photo mask onto the substrate, comprising:

forming a first photosensitive resist film on the substrate on which devices are formed;

exposing the first photosensitive resist film by using a photo mask in which mask patterns are cyclically arranged in a first direction and a second direction which is orthogonal to the first direction and a first aperture having light transmission parts arranged symmetrically with respect to a center point in the first direction;

developing the exposed first photosensitive resist film to form first lines and linear spaces;

forming a second photosensitive resist film on the substrate;

exposing the second photosensitive resist film by using the photo mask and a second aperture having light transmission parts arranged symmetrically with respect to a center point in the second direction; and developing the second photosensitive resist film to form second lines and linear spaces which are orthogonal to the first lines and linear spaces.

18. The method according to claim 17, wherein contact holes are formed on the substrate by etching the substrate by using the first and second photosensitive resist films as a mask.

19. The method according to claim 17, further comprising:

after the second lines and linear spaces are formed, forming a third photosensitive resist film on the substrate;

aligning another photo mask having a mask pattern for selecting an intersecting portion among intersecting portions of linear spaces in the first and second lines and linear spaces so that the mask pattern and the intersecting portion correspond to each other, and exposing the third photosensitive resist film;

developing the third photosensitive resist film; and forming a contact hole on the substrate by etching the substrate by using the third photosensitive resist film as a mask.

20. The method according to claim 17, further comprising:

after the second lines and linear spaces are formed, forming a third photosensitive resist film on the substrate;

aligning a photo mask having a single mask pattern for selecting a plurality of intersecting portions adjacent to each other from intersecting portions of linear spaces in the first and second lines and linear spaces so that the single mask pattern corresponds to the plurality of intersecting portions adjacent to each other, and exposing the third photosensitive resist film;

developing the third photosensitive resist film; and etching the substrate by using the third photosensitive resist film as a mask to form contact holes on the substrate.

* * * * *